United States Patent
Hirler (10) Patent No.: US 9,748,242 B2
(45) Date of Patent: Aug. 29, 2017

(54) SEMICONDUCTOR DEVICE

(71) Applicant: Infineon Technologies Austria AG, Villach (AT)

(72) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/997,970

(22) Filed: Jan. 18, 2016

(65) Prior Publication Data

US 2016/0133627 A1 May 12, 2016

Related U.S. Application Data

(63) Continuation of application No. 14/075,349, filed on Nov. 8, 2013, now Pat. No. 9,257,424.

(51) Int. Cl.
| | | |
|---|---|---|
| *H01L 27/092* | (2006.01) | |
| *H01L 27/088* | (2006.01) | |
| *H01L 27/06* | (2006.01) | |
| *H01L 29/267* | (2006.01) | |
| *H01L 29/778* | (2006.01) | |

(Continued)

(52) U.S. Cl.
CPC ...... *H01L 27/0922* (2013.01); *H01L 27/0623* (2013.01); *H01L 27/0688* (2013.01); *H01L 27/088* (2013.01); *H01L 27/0883* (2013.01); *H01L 29/267* (2013.01); *H01L 29/4236* (2013.01); *H01L 29/7786* (2013.01); *H01L 29/781* (2013.01); *H01L 29/7813* (2013.01);

(Continued)

(58) Field of Classification Search
CPC ............ H01L 27/0922; H01L 29/4236; H01L 29/7813; H01L 29/7786; H01L 27/0883; H01L 27/088
See application file for complete search history.

(56) References Cited

U.S. PATENT DOCUMENTS

| | | |
|---|---|---|
| 5,079,608 A | 1/1992 | Wodarczyk et al. |
| 5,412,228 A | 5/1995 | Baliga |

(Continued)

FOREIGN PATENT DOCUMENTS

| | | |
|---|---|---|
| DE | 19610135 C1 | 6/1997 |
| DE | 19943785 A1 | 3/2000 |
| WO | 2006060337 A2 | 6/2006 |

OTHER PUBLICATIONS

"Smart FET Protection Features", ON Semiconductor, available online at www.onsemi.com/pub/Collateral/TND394-D.PDF, last modified May 5, 2010, pp. 1-25.

*Primary Examiner* — Michael Jung
*Assistant Examiner* — Mikka Liu
(74) *Attorney, Agent, or Firm* — Murphy, Bilak & Homiller, PLLC (57) ABSTRACT

A semiconductor device is provided that includes a composite semiconductor body including a high voltage depletion-mode transistor and a low voltage enhancement-mode transistor. The high voltage depletion-mode transistor is stacked on the low voltage enhancement-mode transistor so that an interface is formed between the high voltage depletion-mode transistor and the low voltage enhancement-mode transistor. The low voltage enhancement-mode transistor includes a current path coupled in series with a current path of the high voltage depletion-mode transistor, and a control electrode is arranged at the interface.

25 Claims, 10 Drawing Sheets

(51) Int. Cl.
*H01L 29/423* (2006.01)
*H01L 29/78* (2006.01)
*H01L 29/417* (2006.01)
*H01L 29/20* (2006.01)

(52) U.S. Cl.
CPC ...... *H01L 29/2003* (2013.01); *H01L 29/4175* (2013.01); *H01L 29/7835* (2013.01)

(56) References Cited

U.S. PATENT DOCUMENTS

| | | |
|---|---|---|
| 7,122,882 B2 | 10/2006 | Lui et al. |
| 7,288,803 B2 | 10/2007 | Beach et al. |
| 7,915,645 B2 | 3/2011 | Briere |
| 8,228,114 B1 * | 7/2012 | Cilio .................... H03K 17/567 327/430 |
| 2008/0230784 A1 | 9/2008 | Murphy |
| 2009/0179227 A1 | 7/2009 | Otake et al. |
| 2010/0301396 A1 | 12/2010 | Briere |
| 2011/0210338 A1 | 9/2011 | Briere |
| 2013/0015499 A1 | 1/2013 | Briere |
| 2015/0014740 A1 * | 1/2015 | Briere .................... H02H 7/10 257/133 |

\* cited by examiner

SEMICONDUCTOR DEVICE

BACKGROUND

To date, transistors used in power electronic applications have typically been fabricated with silicon (Si) semiconductor materials. Common transistor devices for power applications include Si CoolMOS, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

SUMMARY

A semiconductor device is provided that includes a composite semiconductor body including a high voltage depletion-mode transistor and a low voltage enhancement-mode transistor. The high voltage depletion-mode transistor is stacked on the low voltage enhancement-mode transistor so that an interface is formed between the high voltage depletion-mode transistor and the low voltage enhancement-mode transistor. The low voltage enhancement-mode transistor includes a current path coupled in series with a current path of the high voltage depletion-mode transistor, and a control electrode is arranged at the interface.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

A depletion-mode device, such as a high voltage depletion-mode transistor, has a negative threshold voltage which means that it can conduct current at zero gate voltage. These devices are normally on. And enhancement-mode device, such as a low voltage enhancement-mode transistor, has a positive threshold voltage which means that it cannot conduct current at zero gate voltage and is normally off.

As used herein, a "high voltage device", such as a high voltage depletion-mode transistor, is an electronic device which is optimized for high voltage switching applications. That is, when the transistor is off, it is capable of blocking high voltages, such as about 300 V or higher, about 600 V or higher, or about 1200 V or higher, and when the transistor is on, it has a sufficiently low on-resistance (RON) for the application in which it is used, i.e., it experiences sufficiently low conduction loss when a substantial current passes through the device. A high voltage device can at least be capable of blocking a voltage equal to the high voltage supply or the maximum voltage in the circuit for which it is used. A high voltage device may be capable of blocking 300 V, 600 V, 1200 V, or other suitable blocking voltage required by the application.

As used herein, a "low voltage device", such as a low voltage enhancement-mode transistor, is an electronic device which is capable of blocking low voltages, such as between 0 V and $V_{low}$, but is not capable of blocking voltages higher than $V_{low}$. $V_{low}$ may be about 10 V, about 20 V, about 30 V, about 40 V, or between about 5 V and 50 V, such as between about 10 V and 30 V.

As used herein, the phrase "group III-Nitride" refers to a compound semiconductor that includes nitrogen (N) and at least one group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride refers to an alloy described by the formula $Al_xGa_{(1-x)}N$, where x>1.

Figure 1A:
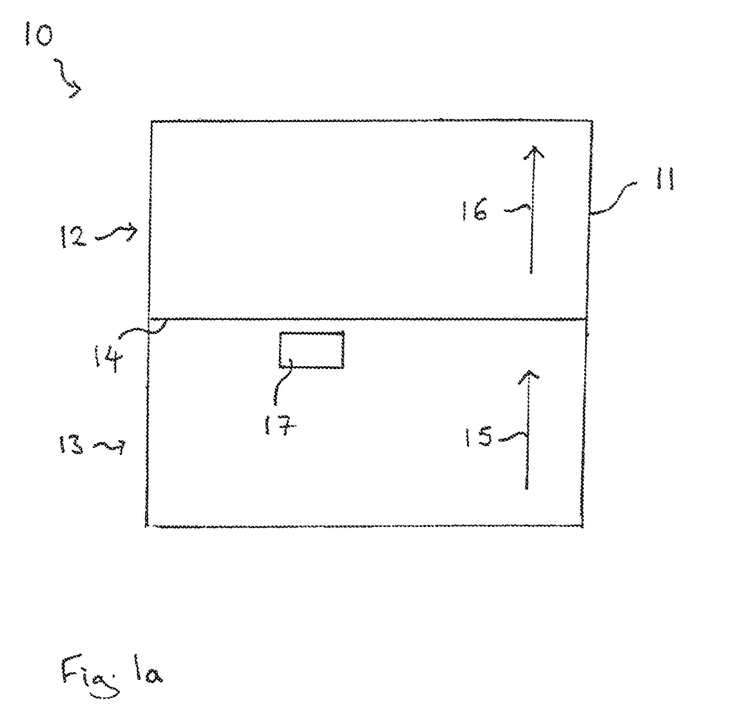
FIG. 1a illustrates a schematic view of a semiconductor device according to a first embodiment.

FIG. 1a illustrates a schematic view of a semiconductor device 10 according to a first embodiment. The semiconductor device 10 includes a composite semiconductor body 11 which includes a high voltage depletion mode transistor 12 and a low voltage enhancement mode transistor 13. The high voltage depletion mode transistor 12 is stacked on the low voltage enhancement mode transistor 13 so that an interface 14 is formed between the high voltage depletion-mode transistor 12 and the low voltage enhancement-mode transistor 13. The low voltage enhancement mode transistor 13 includes a current path, schematically indicated with the arrow 15 in FIG. 1, which is coupled in series with a current path, which is schematically indicated in FIG. 1 with the arrow 16, of the high voltage depletion mode transistor 12. The low voltage enhancement mode transistor 13 further includes a control electrode 17 arranged at the interface 14. The control electrode 17 may be arranged directly at the interface 14 or close to the interface 14.

A semiconductor device 10 is provided which includes a single composite semiconductor body including a high voltage depletion mode transistor 12 and a low voltage enhancement mode transistor 13 arranged in a stack. The control electrode 17 of the low voltage enhancement mode transistor 13 is arranged at the interface 14 between the high voltage depletion mode transistor 12 and the low voltage enhancement mode transistor 13.

The control electrode 17 may be covered by the high voltage depletion mode transistor 12, or arranged adjacent the high voltage depletion mode transistor 12, in which case it is not covered by the high voltage depletion mode transistor 12, or may be buried in the low voltage enhancement mode transistor 13 or may be arranged in a trench extending from an exposed surface of the low voltage enhancement mode transistor 13.

The high voltage depletion mode transistor 12 may be a Group III nitride-based transistor, for example a Group III nitride-based High Electron Mobility Transistor (HEMT). The low voltage enhancement mode transistor 13 may be a silicon-based field effect transistor such as an n-channel MOSFET, a p-channel MOSFET or an IGBT (Insulated Gate Bipolar Transistor). The silicon-based field effect transistor may be a vertical device with a vertical drift path or a lateral device with a lateral drift path. In the case of an IGBT, the semiconductor device 10 may further include a freewheeling diode coupled in parallel with the IGBT.

The high voltage depletion mode transistor 12 and the low voltage enhancement mode transistor 13 may be monolithically integrated to form the composite semiconductor body 11.

The high voltage depletion mode transistor 12 may be operatively connected in a cascode arrangement to the low voltage enhancement mode transistor 13. In embodiments in which the high voltage depletion mode transistor 12 is operatively connected in a cascode arrangement to the low voltage enhancement mode transistor 13, the interface 14 may provide a node of the cascode arrangement.

The high voltage depletion mode transistor 12 may be directly driven, for example by a corresponding gate driver.

The semiconductor device 10 may further include a plurality of conductive elements electrically coupling a drain of the low voltage enhancement mode transistor to a source of the high voltage depletion mode transistor. Neighbouring conductive elements of the plurality of conductive elements may be spaced from one another by a distance which is less than 100 μm.

Figure 1B:
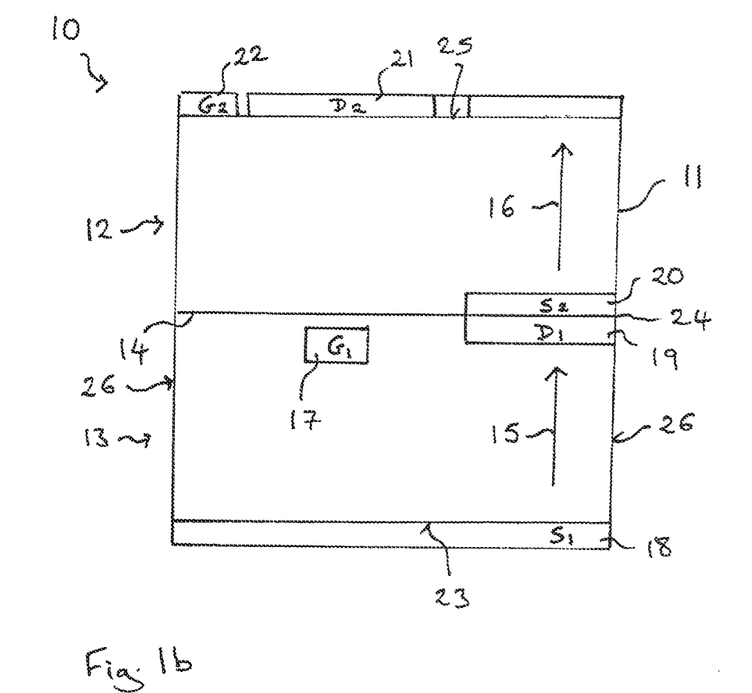
FIG. 1b illustrates a further schematic view of the semiconductor device according to the first embodiment.

FIG. 1b illustrates a further schematic view of the semiconductor device 10 according to the first embodiment and illustrates the electrodes of the high voltage depletion mode transistor and of the low voltage enhancement mode transistor 13.

The low voltage enhancement mode transistor 13 includes a first current electrode 18 and a second current electrode 19 in addition to the control electrode 17. The first current electrode 18 may be a source electrode, as is indicated in FIG. 1 with $S_1$, the second current electrode 19 may be drain electrode, as is indicated in FIG. 1 with $D_1$ and the control electrode 17 may be a gate electrode, as is indicated in FIG. 1 with $G_1$.

The high voltage depletion mode transistor 12 includes a first current electrode 20, a second current electrode 21 and a control electrode 22. The first current electrode 20 may be a source electrode, indicated in FIG. 1 with $S_2$, the second current electrode 21 may be a drain electrode and is indicated in FIG. 1 with $D_2$ and the control electrode 22 may be a gate electrode which is indicated in FIG. 1 as $G_2$.

The current path 15 of the low voltage enhancement mode transistor 13 extends between the first current electrode 18 and the second current electrode 19 and the current path 16 of the high voltage depletion mode transistor 12 extends form the first current electrode 20 to the second current electrode 21.

In the semiconductor device 10 according to the first embodiment, the first current electrode 18 is positioned on a lower surface 23 of the composite semiconductor body 11 and the second current electrode 19 is positioned at the interface 14 between the low voltage enhancement mode transistor 13 and the high voltage depletion mode transistor 12. The first current electrode 20 of the high voltage depletion mode transistor 12 is also positioned at the interface 14 and is in direct contact with the first current electrode 19 of the low voltage enhancement mode transistor 13. In this region of the composite semiconductor body 11, the interface 14 between the first current electrode 19 and the second current electrode 20 forms a node 24 between the first current path 15 and second current path 16.

The second current electrode 21 and the gate electrode 22 of the high voltage depletion mode transistor are arranged on an upper surface 25 of the composite semiconductor body 11 and, therefore, oppose the first current electrode 18 of the low voltage enhancement mode transistor 13.

The control electrode 17 of the low voltage enhancement mode transistor 13 is positioned at the interface 14 between the low voltage enhancement mode transistor 13 and the high voltage depletion mode transistor 12. The control electrode 17 may be positioned directly at the interface 14 and form a part of the interface 14 or may be positioned in the direct vicinity of the interface 14 within the body of the low voltage enhancement mode transistor 13. The control electrode 17 is, therefore, not positioned on the lower surface 23 of the semiconductor body 11 or on a side face 26 of the semiconductor body 11.

Figure 2A:
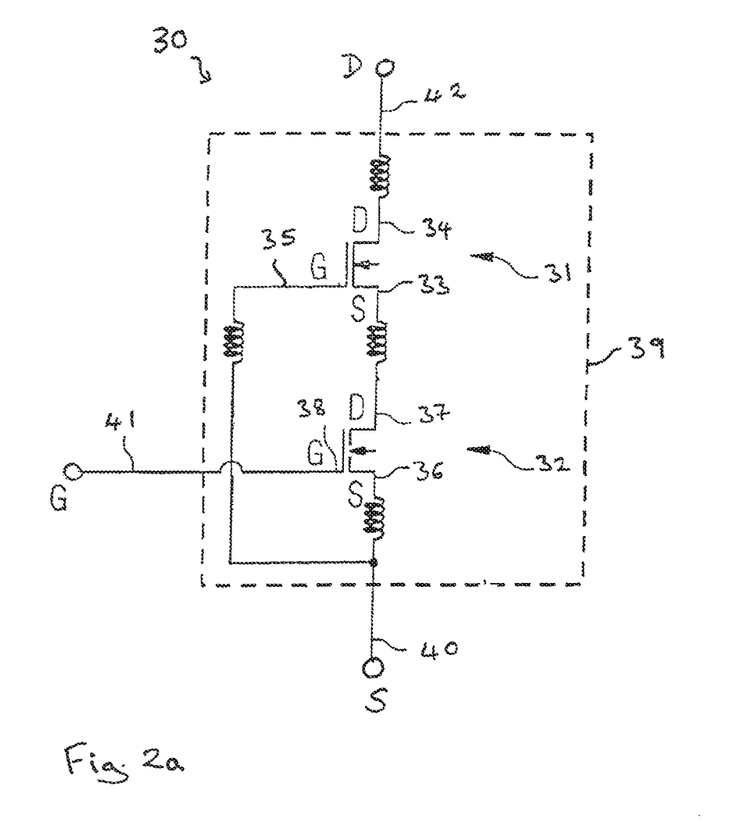
FIG. 2a illustrates a schematic view of a cascode circuit.

The high voltage depletion mode transistor 12 is, in operation, normally on. In embodiments in which it is desirable that the high voltage depletion mode transistor 12 is normally off, this may be achieved by operatively connecting the high voltage depletion mode transistor 12 in a cascode arrangement to the low voltage enhancement mode transistor 13. FIG. 2 illustrates a schematic diagram of a circuit including a cascode arrangement.

Figure 3:
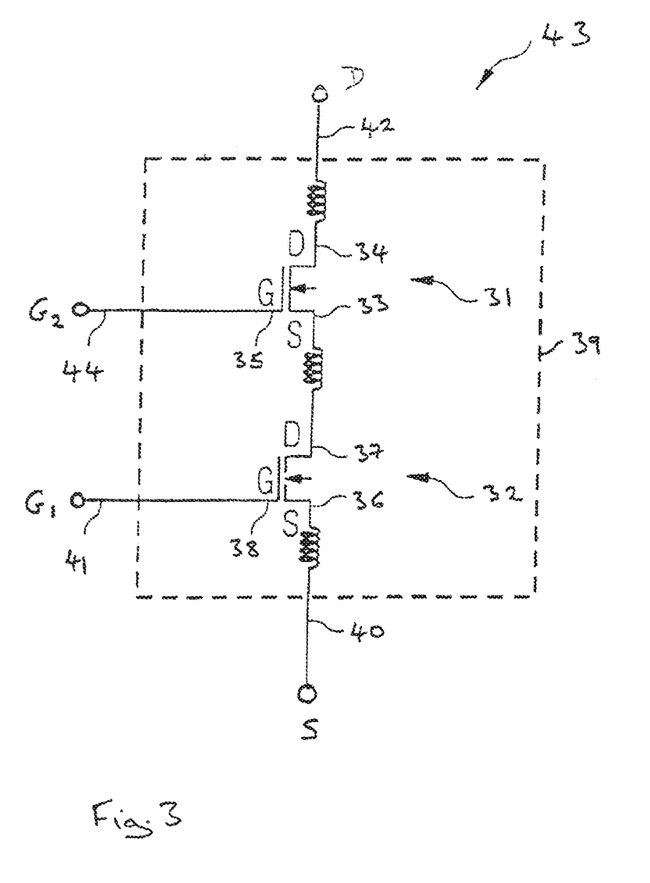
FIG. 3 illustrates a schematic view of a circuit including a directly driven high voltage depletion mode transistor.

The high voltage depletion mode transistor 12 may also be directly driven, that is the control electrode 22 may be driven by a second gate driver circuit which is provided in addition to a first gate driver circuit for driving the control electrode 17 of the low voltage enhancement mode transistor 13. FIG. 3 illustrates a schematic diagram of a circuit including a directly driven high voltage depletion mode transistor 12.

Turning to FIG. 2a, in a cascode circuit 30, a high voltage depletion-mode transistor 31, which is normally on, is combined with a low voltage enhancement-mode transistor 32, which is normally off, to form a hybrid device which is normally off.

The high voltage depletion-mode transistor 31 includes a source 33, a drain 34 and a gate 35. The low voltage enhancement-mode transistor 32 also includes a source 36, a drain 37 and a gate 38.

The source 33 of the high voltage depletion-mode transistor 31 is electrically connected to the drain 37 of the low voltage enhancement-mode transistor 32. The gate 35 of the high voltage depletion-mode transistor 31 is electrically coupled with the source 36 of the low voltage enhancement-mode transistor 32.

The high voltage depletion-mode transistor 31 and the low voltage enhancement-mode transistor 32 are provided in a single composite semiconductor body, illustrated schematically in FIG. 2a with a dashed line 39, which includes a source electrode 40, a gate electrode 41 and a drain electrode 42. The source electrode 40 may be denoted as a low voltage lead and the drain electrode 42 may be denoted as a high voltage lead. In the example illustrated in FIG. 2a, 0 V may be applied to the low voltage lead 40 and 600 V to the high voltage lead 42. The high voltage lead 42 may be connected to a load or another transistor configuration which is connected to a high voltage, for example 400V, node. The low voltage lead 40 may be connected to a load or a transistor which is connected to a low voltage, for example 0V.

The source 36 of the low voltage enhancement-mode transistor 32 and the gate 35 of the high voltage depletion-mode transistor 31 are both electrically coupled to the source electrode 40. The gate 38 of the low voltage enhancement-mode transistor 32 is electrically coupled to the gate electrode 41. The drain 34 of the high voltage depletion-mode transistor 32 is electrically coupled to the drain electrode 42.

Figure 2B:
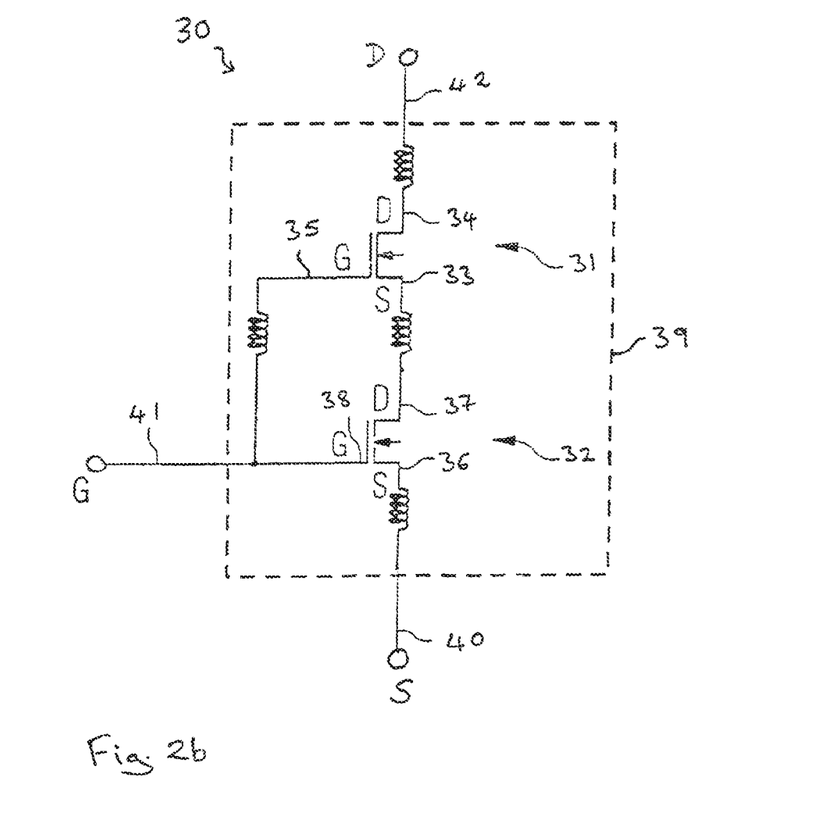
FIG. 2b illustrates a schematic view of a circuit including a directly driven high voltage depletion mode transistor.

FIG. 2b illustrates a schematic diagram of a circuit 30 in which the gate 35 of the high voltage depletion-mode transistor 31 is directly driven, rather than being electrically coupled with the source 36 of the low voltage enhancement-mode transistor 32.

The arrangement differs from that of the cascode circuit illustrated in FIG. 2a by the electrical connection to the gate electrode 35 of the high voltage depletion-mode transistor 31. In this embodiment, the gate 35 of the high voltage depletion-mode transistor 31 is electrically coupled to the gate electrode 41 of the low voltage enhancement mode transistor 32 and is directly controlled by use of the gate electrode 41 which acts as a common gate electrode. The gate 35 of the high voltage depletion mode transistor 31 and the gate 38 of the low voltage enhancement mode transistor 32 may be coupled to a common gate driver via additional resistors or diodes. Clamping structures, for example Zener diodes, may be provided to limit the gate voltage of one or both transistors 31, 32. This may provide a lower value of Ron for the high voltage depletion mode transistor 31.

FIG. 3 illustrates a schematic diagram of a circuit 43 in which the gate 35 of the high voltage depletion-mode transistor 31 is directly driven, rather than being electrically coupled with the source 36 of the low voltage enhancement-mode transistor 32.

The arrangement differs from that of the cascode circuit illustrated in FIG. 2a by the electrical connection to the gate electrode 35 of the high voltage depletion-mode transistor 31. In this embodiment, the gate electrode 35 of the high voltage depletion-mode transistor 31 is electrically coupled to a second gate electrode 44 and is directly controlled by use of the second gate electrode 44. In this arrangement two different gate drivers may be used.

The wiring may cause parasitic inductances as illustrated in FIGS. 2a and 2b. These parasitic inductances may lead to switching losses. The parasitic inductances may be reduced by monolithic integration of the high voltage depletion mode transistor and the low voltage enhancement mode transistor. In embodiments in which the source of the high voltage depletion mode transistor is monolithically integrated with the drain of the low voltage enhancement mode transistor, the parasitic inductance of the node between the source of the high voltage depletion mode transistor and the drain of the low voltage enhancement mode transistor.

Figure 4:
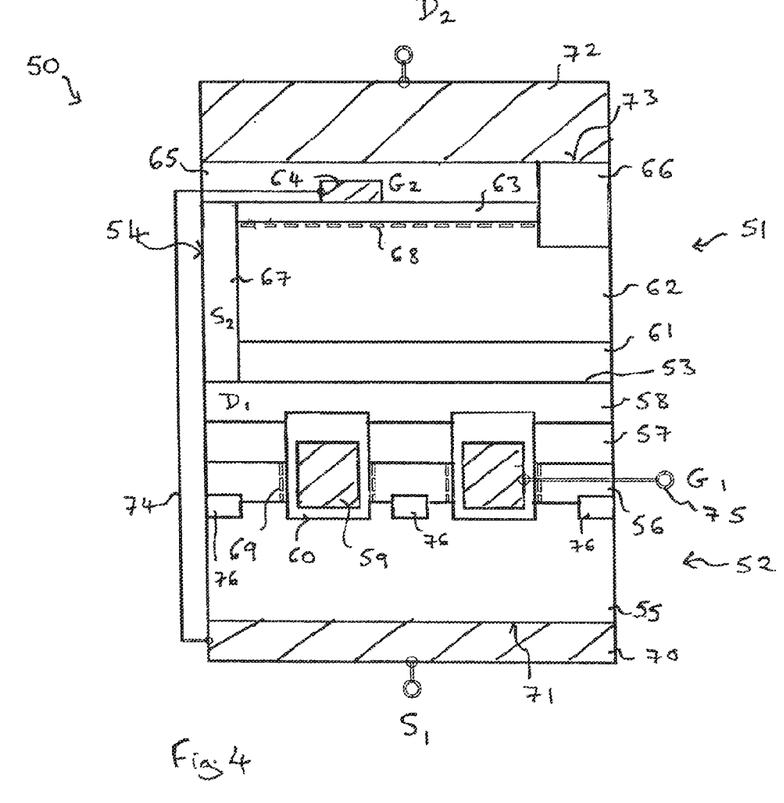
FIG. 4 illustrates a semiconductor device according to a second embodiment.

FIG. 4 illustrates a semiconductor device 50 including a composite semiconductor body 54 which includes a high voltage depletion mode transistor in the form of a gallium nitride-based HEMT 51 stacked on a low voltage enhancement mode transistor in the form of an a silicon-based n-channel MOSFET 52, whereby an interface 53 is formed between the gallium nitride-based HEMT 51 and the MOSFET 52. Since the MOSFET 52 is silicon-based and the HEMT 51 is gallium nitride-based and the MOSFET 51 and HEMT 52 are provided in a common semiconductor body 54, the semiconductor body 54 can be considered as a composite semiconductor body in which the gallium nitride-based HEMT 51 and the silicon-based MOSFET 52 are monolithically integrated.

The MOSFET 52 includes a first highly doped n+ layer 55, a p-doped layer 56 positioned on the first highly doped n+ layer 55, a lightly doped n− layer 57 positioned on the p-doped layer 56 and a second highly doped n+ layer 58 positioned on the lightly doped n− layer 57. The first highly doped n+ layer 55 provides the source and the second highly doped n+ layer 58 provides the drain of the MOSFET device 52. The MOSFET device 52 is a vertical device with a vertical drift path. The gate 59 is arranged in the p layer 56 and extends into the adjacent first highly doped n+ layer 55 and lightly doped n− layer 57. The gate 59 is insulated from the surrounding silicon layers 55, 56, 57 by an insulating material 60.

The MOSFET 52 has a source down arrangement. However, the gate 59 is not positioned on the same surface as the source, i.e. in the first highly doped n+ layer 55, but is buried within the body of the MOSFET device 52. The gate 59 is arranged directly under, and is covered by, the gallium-nitride based HEMT 51. The channel of the MOSFET device is formed in the p-doped layer 56 and is indicated by the dashed line 69 in FIG. 4.

The gate 59 may extend into the second highly doped n+ layer 58. Metallic plugs 76 may be provided at the interface between the first highly doped n+ layer 55 and the p layer 56 which extend into the first highly doped n+ layer 55 and the p layer 56. The metallic plugs may enable the first highly doped n+ layer 55 and the p layer 56 to be shortened.

The first n+ layer 55 may be p+ doped rather than n+ doped. If the layer 55 is p+ doped, n+ source regions at the gate 59 with a metallic connection to the p+ layer 55 may be provided.

The silicon-based MOSFET device 52 may be considered to provide a substrate for the subsequent growth of the gallium nitride-based HEMT 51 onto the second highly doped n+ layer 58.

The gallium nitride-based HEMT 51 includes a buffer layer 61 including aluminium nitride which is positioned directly on the n+ layer 58 providing the drain of the MOSFET 52. The gallium nitride-based HEMT 51 and the MOSFET 52 are monolithically integrated and form a composite semiconductor body 54 as the gallium nitride-based HEMT 51 is deposited layer-by-layer on the MOSFET 52. The interface between the buffer layer 61 and the n+ layer 58 provides the interface 53 between the low voltage enhancement mode transistor 52 and the high voltage depletion mode transistor 51.

The gallium nitride-based HEMT 51 further includes a channel layer 62 including gallium nitride (GaN) positioned on the buffer layer 61 and a barrier layer 63 including aluminium gallium nitride or aluminium nitride positioned on the channel 62. The barrier layer 63 may include an alloy described by the formula $Al_xGa_{(1-x)}N$, where x<1 or may include aluminium nitride or a superlattice of, for example, GaN, AlN and AlGaN layers.

The gallium nitride-based HEMT 51 further includes a gate 64 arranged on the barrier layer 63 and passivation layer 65 covering the gate 64 and the barrier layer 63. The gallium nitride-based HEMT further includes a drain 66 which extends through the passivation layer 65, the barrier layer 63 and into the channel layer 62.

The gallium nitride-based HEMT 51 further includes a source 67 which extends through the barrier layer 63, through channel layer 62 and the buffer layer 61 and is in direct contact with a portion of the second highly doped n+ layer 58 which provides the drain of the MOSFET device 52. Consequently, the source 67 of the gallium nitride-based attempt 51 is electrically coupled to the drain 58 of the MOSFET 52. Although one source region 67 in the form of a source plug is illustrated in FIG. 4, a plurality of isolated source plugs or columns may be provided, spaced at lateral intervals from one another. The source 67 is conductive and may be metallic or may include a silicide or highly doped poly silicon. A plurality of source plugs 67 may be provided to reduce or minimize the inductance between the source 67 of the high voltage depletion mode transistor 51 and the drain 58 of the high voltage enhancement mode transistor 52. The spacing between adjacent source plugs may be less than 100 µm or less than 30 µm.

The bandgaps of the GaN of the channel layer 62 and AlGaN of the barrier layer differ so that a heterojunction is formed at the interface between the respective layers. A polarization induced a two-dimensional gas is formed at the heterojunction formed between the aluminium gallium nitride layer 63 and the gallium nitride layer 62 and is indicated by the dotted line 68 in FIG. 4. The source 67 and the drain 66 are electrically coupled to the two-dimensional electron gas 68. The gate 64 is positioned laterally between the source 67 and the drain 66. Current flow between the source 67 and the drain 66 is controlled by switching the gate 64.

In the embodiment illustrated in FIG. 4, the gate 64 of the gallium nitride-based HEMT 51 is electrically coupled and operatively connected to the source of the MOSFET 52 and, in particular, source electrode 70 positioned on the lower surface 71 in a cascode configuration. The electrical connection is indicated in FIG. 4 with reference number 74.

The electrical connection 74 between the gate 64 and the source 70 may be provided by an electrically conductive via which extends through the composite semiconductor body 54 or may be provided by a redistribution structure external to the composite semiconductor body 54, for example by bond wires or other electrical connections within a package in which the semiconductor device 50 is mounted.

The upper surface 73 of the composite semiconductor body 54 is provided by the passivation layer 65 and the drain 66. The semiconductor device 50 further includes a metallic drain electrode metallic drain electrode 72 positioned on the drain 66 and may also extend over a portion of the passivation layer 65.

The gate 59 of the MOSFET 2 is electrically coupled to a gate electrode 75 which is accessible external to the composite semiconductor body 54.

The gallium nitride-based HEMT 51 is cascoded with the MOSFET device 52 and forms a hybrid semiconductor device 50 having a source electrode 70, a drain electrode 72 and a gate electrode 75 which provide outer contacts.

The structure of the gallium nitride-based HEMT 51 and the structure of the MOSFET 52 are not limited to the arrangement illustrated in FIG. 4 and may differ. For example, the gate 64 of the high voltage depletion mode transistor 51 is illustrated as a Schottky gate. However, the gate 64 may also include a gate oxide positioned between the gate 64 and the barrier layer 63. The gate 64 may also have a recessed gate structure. The drain 66 of the high voltage depletion mode transistor 51 is illustrated as extending into the channel layer 62. However, the drain 66 may also be positioned on the barrier layer 63.

The low voltage enhancement mode transistor 52 is not limited to an n-channel MOSFET, but may also be a p-channel MOSFET, in which case the conductivity types of the layers 55, 56, 57, 58 reverses and position of the source and drain reverses.

Figure 5:
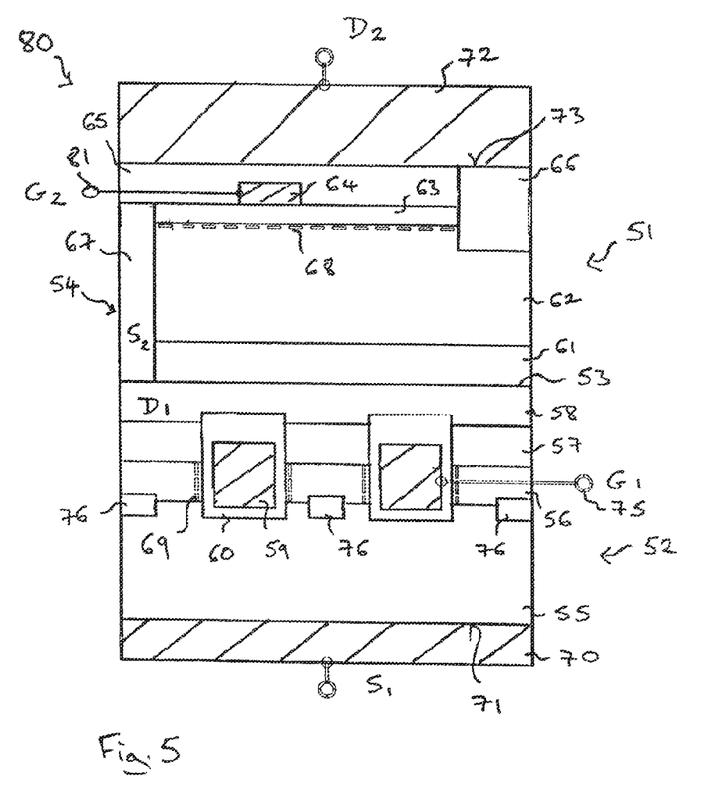
FIG. 5 illustrates a semiconductor device according to a third embodiment.

FIG. 5 illustrates a semiconductor device 80 according to a third embodiment. The semiconductor device 80 includes a gallium nitride-based HEMT 51 stacked on an n-channel MOSFET device 52 within a composite semiconductor body 54 similar to the semiconductor device 50 according to the second embodiment. Therefore, like features are indicated with like references and not necessarily described again.

The semiconductor device 80 of the third embodiment differs from the semiconductor device 50 of the second embodiment by the electrical connection to the gate 64 of the gallium nitride-based HEMT 51. In the semiconductor device 80 according to the third embodiment, the gallium nitride-based HEMT 51 is directly driven. Consequently, the gate 64 of the gallium nitride-based HEMT 51 is not coupled to the source electrode 70 of the MOSFET device 52 but is coupled to a second gate electrode 81 which may be electrically coupled to a second gate driver circuit.

The semiconductor device 80 has four electrodes as outer contacts, the source electrode 70, the drain electrode 72, the first gate electrode 75 and the second gate electrode 81.

Figure 6:
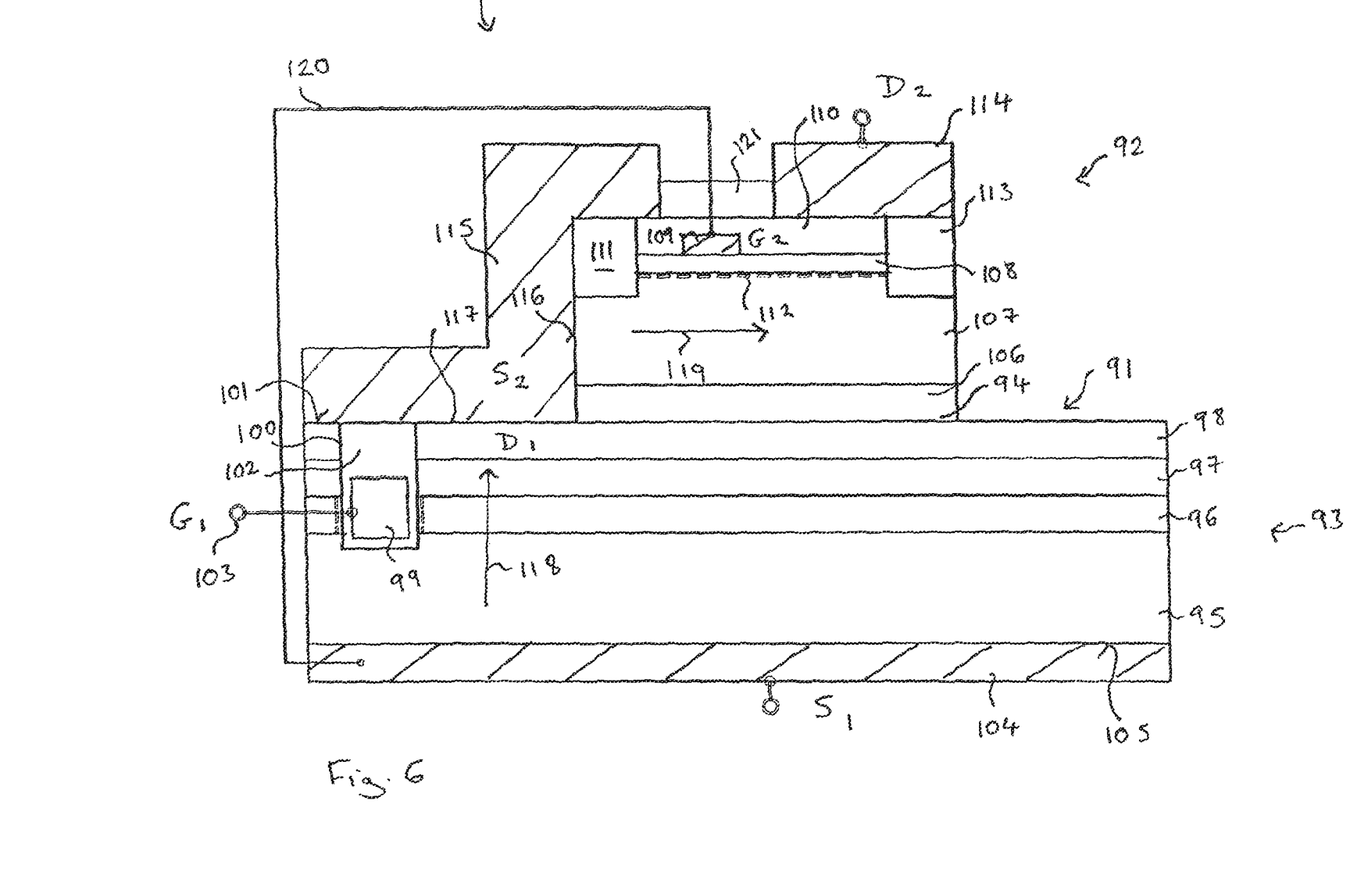
FIG. 6 illustrates a semiconductor device according to a fourth embodiment.

FIG. 6 illustrates a semiconductor device 90 according to a fourth embodiment. The semiconductor device 90 includes a composite semiconductor body 91 including a high voltage depletion mode transistor 92 stacked on a low voltage enhancement mode transistor 93 such that an interface 94 is formed between the high voltage depletion mode transistor 92 and the low voltage enhancement mode transistor 93.

The high voltage depletion mode transistor 92 is a gallium nitride-based transistor, in particular, a gallium nitride-based HEMT. The low voltage enhancement mode transistor 93 is a silicon-based n-channel MOSFET device. Since the high voltage depletion mode transistor 92 and the low voltage enhancement mode transistor 93 include differing materials and are monolithically integrated in a single body, they can be considered to form the composite semiconductor body 91.

The low voltage enhancement mode transistor 93 includes a first highly doped layer 95 of a first conductivity type, a second doped layer 96 of a second conductivity type which is complementary to the first conductivity type. The second doped layer 96 is arranged on the first highly doped layer 95. The low voltage enhancement mode transistor 93 further includes a third lightly doped layer 97 of the first conductivity type arranged on the second doped layer 96 and a fourth highly doped layer 98 of the first conductivity type are arranged on the third lightly doped layer 97.

The first highly doped layer 95 provides a source and the fourth highly doped layer 98 provides a drain of the low voltage enhancement mode transistor 93. The low voltage enhancement mode transistor 93 further includes a gate 99 positioned in a trench 100 which extends from an upper surface 101 of the fourth highly doped layer 98 through the fourth highly doped layer 98, the third lightly doped layer 97, the second doped layer 96 and into the first highly doped layer 95.

The gate 99 is positioned in the trench 100 and is insulated from the surrounding silicon layers by an oxide 102. The gate 99 is electrically coupled to a gate electrode 103 which is accessible from outside of the semiconductor body 91. The low voltage enhancement mode transistor 93 further includes a source electrode 104 which is arranged on the lower surface 105 of the first highly doped layer 95. The source electrode 104 is metallic and is accessible from outside of the composite semiconductor body 91.

The lateral extent of the high voltage depletion mode transistor 92 is less than the lateral extent of the low voltage enhancement mode transistor 93. A portion of the upper surface 101 of the fourth highly doped layer 98 forms the interface 94 with the high voltage depletion mode transistor 92. A further portion of the fourth highly doped layer 98 is uncovered by the high voltage depletion mode transistor 92 so that a portion of the fourth highly doped layer 98 forms the surface 101 of the composite semiconductor body 91. The gate 99 is positioned adjacent the high voltage depletion mode transistor 91 and is not covered by the high voltage depletion mode transistor 91.

The high voltage depletion mode transistor 92 includes a buffer layer 106 which is positioned on a region of the upper surface 101 of the fourth highly doped layer 98 such that it is positioned adjacent the trench 100 including the gate 99. The buffer layer may include AlN. The high voltage enhancement mode depletion mode transistor 92 further includes a gallium nitride layer 107 arranged on the buffer layer 106, an aluminium gallium nitride layer 108 arranged on the gallium nitride layer 107, a gate 109 arranged on the aluminium gallium nitride layer 108 and a passivation layer 110 covering the date 109. The gallium nitride layer 107 may be denoted as a channel layer and the aluminium gallium nitride layer as a barrier layer. Aluminum gallium nitride refers to an alloy described by the formula $Al_xGa_{(1-x)}N$, where x<1.

The high voltage depletion mode transistor 92 includes a source 111 extending from the upper surface of the passivation layer 110 to the gallium nitride layer 107 so that it makes contact with the aluminium gallium nitride layer 108 and two-dimensional gas 112 formed the interface between the gallium nitride layer 107 and the aluminium gallium nitride layer 108. Similarly, the high voltage depletion mode transistor 92 includes a drain 113 which extends from the upper surface of the passivation layer 110 into the gallium nitride layer 107, such that it makes contact with the two-dimensional gas 112 and the aluminium gallium nitride layer 108. The gate electrode 109 is positioned laterally between the source 111 and the drain 113.

The semiconductor device further includes a drain electrode 114 which is metallic and which is positioned on, and electrically coupled with, the drain 113 and is partially positioned on the passivation layer 110. The semiconductor device 90 further includes a source electrode 115 which is positioned on the source 111 and extends over the side face 116 of the source 111 or over an additional passivation layer arranged on the side face 116 of the source 111, the gallium nitride layer 107, the aluminium nitride buffer layer 106 and onto the upper surface 101 of the fourth highly doped layer 98 forming the drain of the low voltage enhancement mode transistor 93. The source electrode 115 may also cover the trench 100 in which the gate 99 is positioned.

An additional lightly doped silicon layer may be provided between the fourth highly doped layer 99 and the buffer layer 106 which is removed in at least part of the contact area of the source electrode 115.

The source electrode 115 is electrically insulated from the gate 99 by the oxide 102 filling the upper region of the trench 100 and is in electrical contact with the fourth highly doped layer 98 forming the drain. Therefore, the region of the interface 94 between the high voltage in depletion mode transistor 92 and the low voltage enhancement mode transistor 93 which is positioned adjacent the side face 116 of the high voltage depletion mode transistor 92 forms the node 117 between a current path 118 of the low voltage enhancement mode transistor 93 and a current path 119 of the high voltage depletion mode transistor 92. The source electrode 115 does not have to be accessible outside of the semiconductor body 91, but is, in this embodiment exposed.

The arrangement of the source electrode 115 over the side face 116 of the high voltage depletion mode transistor 92 avoids the need for the fabrication of vias within the gallium nitride-based layers 106, 107, 108. In addition, the stress between GaN and silicon layers and the wafer bow may be reduced by removing or omitting the GaN layer partially over the low voltage enhancement mode transistor 93. The source electrode 115 may be further electrically insulated from the drain electrode 114 by an additional insulating layer 121 which extends between the source electrode 115 and the drain electrode 114.

In the embodiment illustrated in FIG. 6, the gate 109 of the high voltage depletion mode transistor 92 is electrically coupled to the source 104 of the low voltage enhancement mode transistor 93 in a cascode configuration by the connection 120.

Figure 7:
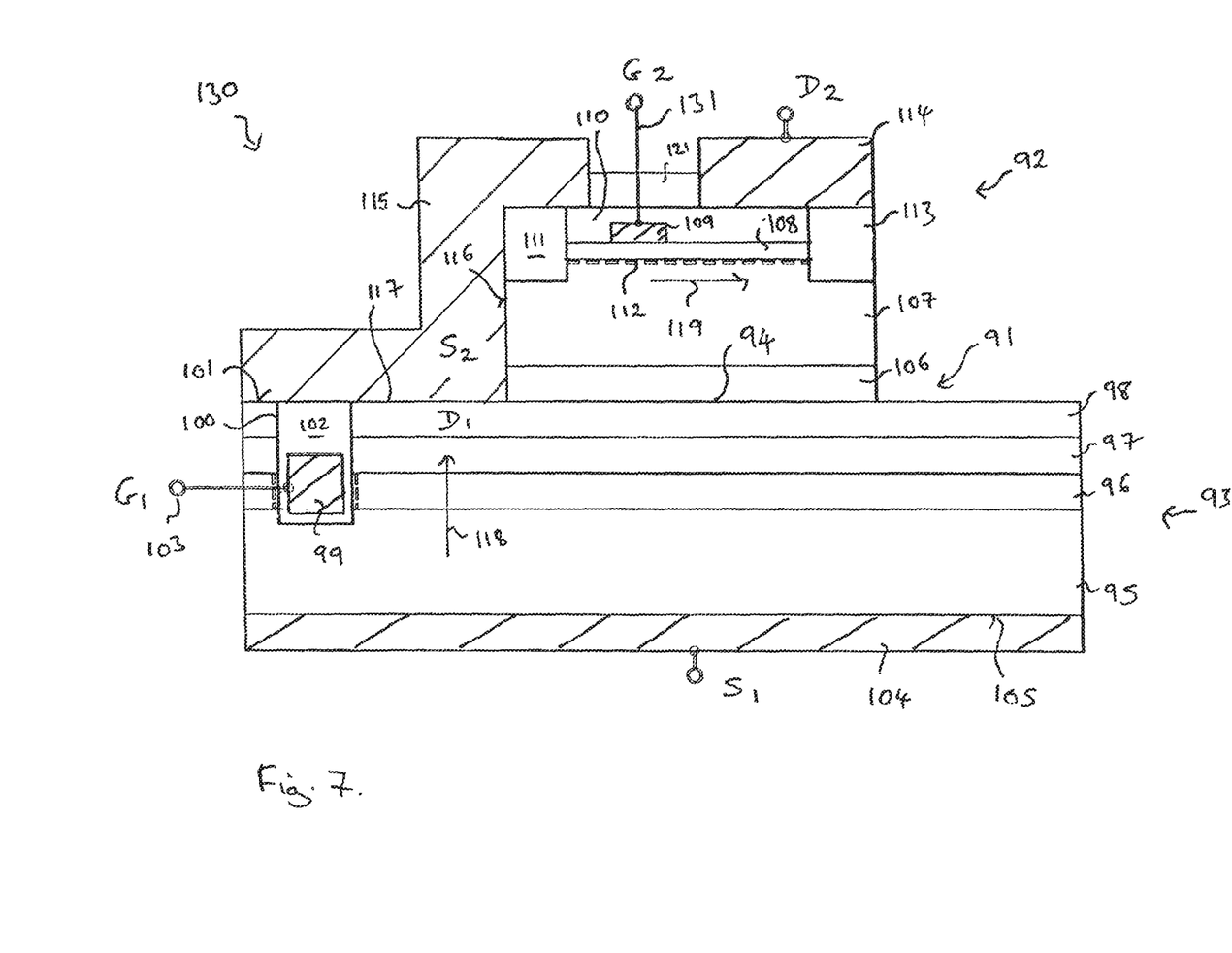
FIG. 7 illustrates a semiconductor device according to a fifth embodiment.

FIG. 7 illustrates a semiconductor device 130 according to a fifth embodiment. The semiconductor device 130 includes a composite semiconductor body 91 including a high voltage depletion mode transistor 92 stacked on a low voltage enhancement mode transistor 93 having similar features to those disclosed in connection with FIG. 6. Therefore, like features are indicated with like references and not necessarily described again.

The difference between the device 130 according to the fifth embodiment and the semiconductor device 90 according to the fourth embodiment is that the high voltage depletion mode transistor 92 is directly driven. Therefore, the electrical connection 120 of the semiconductor device 90 according to the fourth embodiment is replaced by a second gate 131 which is accessible from outside of the semiconductor body 91 and which may be coupled to a second gate driver for directly driving the gate 109 of the high voltage enhancement mode transistor 92.

Figure 8:
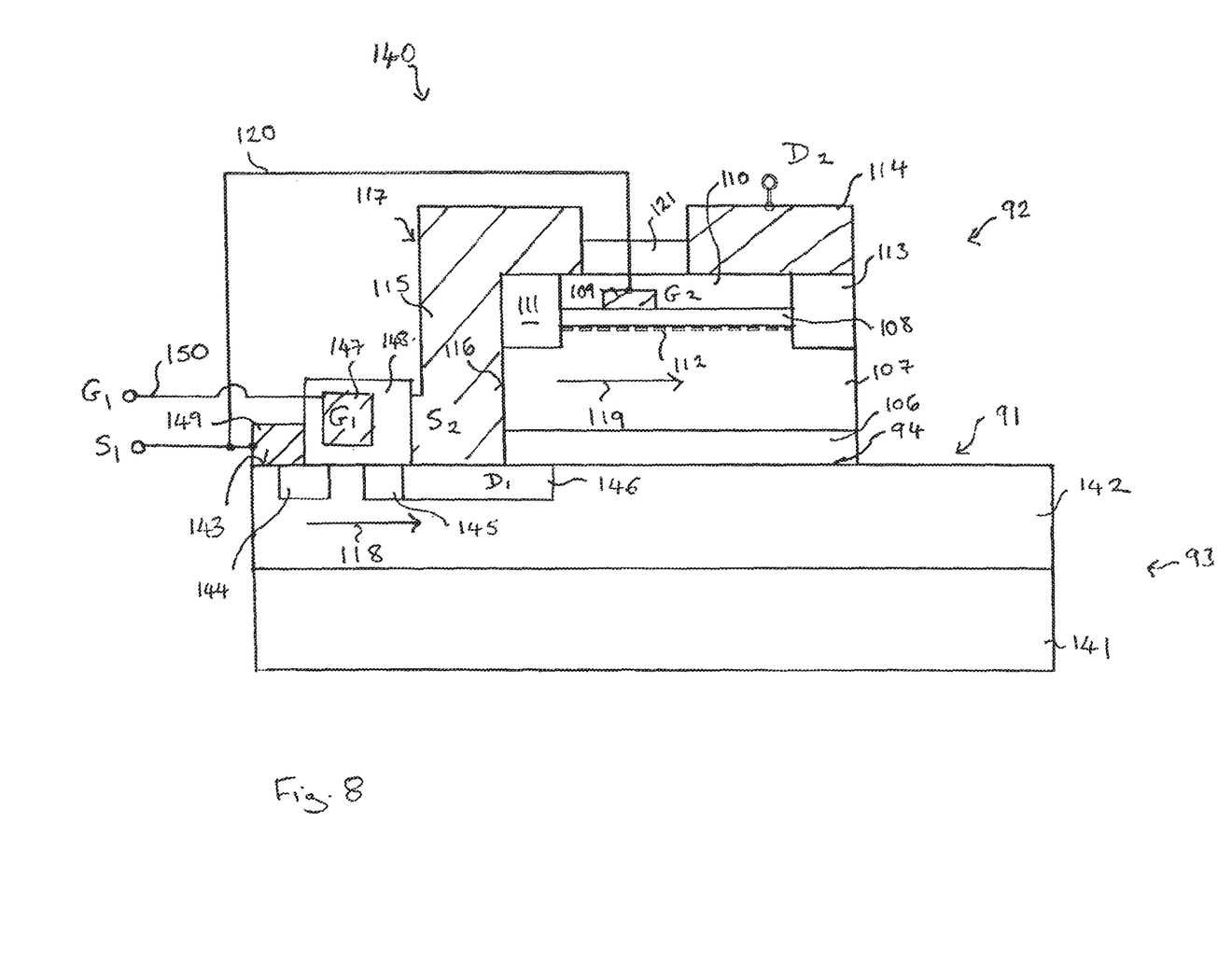
FIG. 8 illustrates a semiconductor device according to a sixth embodiment.

FIG. 8 illustrates a semiconductor device 140 according to a sixth embodiment. The semiconductor device 140 includes a composite semiconductor body 91 including a high voltage depletion mode transistor 92 stacked on a low voltage enhancement mode transistor 93 such that an interface 94 is formed between the high voltage depletion mode transistor 92 and the low voltage enhancement mode transistor 93.

The high voltage depletion mode transistor 92 is a gallium nitride-based transistor, in particular, a gallium nitride-based HEMT having similar features to those described in connection with FIGS. 6 and 7. Similar features are indicated with the same reference number. The low voltage enhancement mode transistor 93 is a silicon-based MOSFET device. Since the high voltage depletion mode transistor 92 and the low voltage enhancement mode transistor 93 include differing materials and are monolithically integrated in a single body, they can be considered to form the composite semiconductor body 91.

The low voltage enhancement mode transistor 93 is a lateral FET device with a lateral drift path rather than a vertical FET device having a vertical drift path as in the embodiments illustrated in FIGS. 6 and 7. The current path of the low voltage enhancement mode transistor 93 is schematically illustrated in FIG. 8 by arrow 118.

The low voltage enhancement mode transistor 93 includes a substrate 141 including silicon and a silicon layer 142 of a second conductive type arranged on the substrate 141. The high voltage depletion mode transistor 92 is laterally smaller than the low voltage enhancement mode transistor 93. A portion of the upper surface 143 of the layer 142 forms the interface 94 with the high voltage depletion mode transistor 92 and, in particular, with the buffer layer 106 of the high voltage depletion mode transistor 92. A portion of the substrate 141 and silicon layer 142 extend adjacent to at least one side face 116 of the high voltage depletion mode transistor 92 and is uncovered by the high voltage depletion mode transistor 92. The drift path of the low voltage enhancement mode transistor 93 is positioned in the region of the layer 142 which is positioned laterally adjacent the high voltage depletion mode transistor 92.

The low voltage enhancement mode transistor 93 includes a first highly doped well 144 of a first conductivity type, which is complementary to the second conductive type, extending from the upper surface 143 of the layer 142 into the upper region of the layer 142, a second lightly doped well 145 of the first conductivity type spaced apart from the first highly doped well 144 by a portion of the layer 142 and a third highly doped well 146 of the first conductivity type. The third highly doped well borders and contacts the second lightly doped well 145 and extends under the source electrode 115 and a portion of the buffer layer 106.

The low voltage enhancement mode transistor 93 first includes a gate 147 surrounded by a gate dielectric 148 which is positioned on the upper surface 143 of the layer 142 and between the first highly doped well 144 and the second lightly doped well 145.

The first highly doped well 144 provides the source of the low voltage enhancement mode transistor 93 and is electrically coupled to a source electrode 149 which is arranged on the upper surface 143 of the layer 142 and contacts the first highly doped well 144. The source electrode 149 is metallic and is accessible from outside of the composite semiconductor body 91.

The third highly doped well 146 provides the drain of the low voltage enhancement mode transistor 93 and is coupled to the source 111 of the high voltage depletion mode transistor 92 by means of the source electrode 115 which contacts the third highly doped well 146 and which extends over the side face 116 of the high voltage depletion mode transistor 92 to the source 111 of the high voltage depletion mode transistor 92.

The gate 147 is electrically coupled to a gate electrode 150 which is accessible from outside of the composite semiconductor body 91. The gate dielectric 148 electrically insulates the gate 147 from the source electrode 115 and from the source electrode 149 which are arranged adjacent to the gate dielectric 148 on the upper surface 143 of the layer 142.

The MOSFET device 93 may be a n-channel device in which case the layer 142 is p-doped, the first high doped well 144 is n+, the second lightly doped well 145 is n− and the third highly doped well 146 is n+. The MOSFET device 93 may be a p-channel device in which case the layer 142 is n-doped, the first high doped well 144 is p+, the second lightly doped well 145 is p− and the third highly doped well 146 is p+.

In the embodiment illustrated in FIG. 8, the gate 109 of the high voltage depletion mode transistor 92 is electrically coupled to the source 144 of the low voltage enhancement mode transistor 93 in a cascode configuration by the connection 120. However, the arrangement is not limited to a cascode configuration and the gate 109 of the high voltage depletion mode transistor 92 may also be directly driven by a corresponding gate driver.

The semiconductor device according to one of the previously described embodiments may be fabricated by first fabricating the low voltage enhancement mode transistor and then using the low voltage enhancement mode transistor as a substrate for the deposition of the high-voltage depletion mode transistor.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a composite semiconductor body, comprising:
a high voltage depletion-mode transistor; and
a low voltage enhancement-mode transistor,
wherein the high voltage depletion-mode transistor is stacked on the low voltage enhancement-mode transistor so that an interface is formed between the high voltage depletion-mode transistor and the low voltage enhancement-mode transistor,
wherein the low voltage enhancement-mode transistor comprises a current path coupled in series with a current path of the high voltage depletion-mode transistor and a control electrode arranged at the interface,
wherein the control electrode is positioned laterally adjacent to the current path of the low voltage enhancement-mode transistor,
wherein a drain of the high voltage depletion-mode transistor is electrically coupled to a high voltage lead,
wherein a source of the low voltage enhancement-mode transistor is electrically coupled to a low voltage lead,
wherein a source of the high voltage depletion-mode transistor is electrically coupled internally to a drain of the low voltage enhancement-mode transistor.

2. The semiconductor device of claim 1, wherein the high voltage depletion-mode transistor is one of a Group III-N transistor and a Group III-N HEMT, and wherein the low voltage enhancement-mode transistor is a silicon-based lateral field effect transistor having a lateral drift path.

3. The semiconductor device of claim 2, wherein the low voltage enhancement mode transistor comprises a silicon substrate and a silicon layer of a second conductivity type arranged on the substrate, and wherein a portion of an upper surface of the silicon layer forms the interface.

4. The semiconductor device of claim 2, wherein a portion of the substrate and the silicon layer extend adjacent to at least one side face of the high voltage depletion mode transistor and are uncovered by the high voltage depletion mode transistor.

5. The semiconductor device of claim 2, wherein the drift path of the low voltage enhancement mode transistor is positioned in the region of the silicon layer which is positioned laterally adjacent the high voltage depletion mode transistor.

6. The semiconductor device of claim 2, wherein the low voltage enhancement mode transistor comprises a gate surrounded by a gate dielectric which is positioned on the upper surface of the silicon layer and between a first highly doped well and a second lightly doped well.

7. The semiconductor device of claim 1, wherein the control electrode is uncovered by the high voltage depletion-mode transistor.

8. The semiconductor device of claim 1, wherein the control electrode is arranged in a trench extending from an exposed surface of the low voltage enhancement-mode transistor.

9. The semiconductor device of claim 1, wherein the high voltage depletion-mode transistor is one of a Group III-N transistor and a Group III-N HEWT, and wherein the low voltage enhancement-mode transistor is a silicon-based vertical field effect transistor having a vertical drift path.

10. The semiconductor device of claim 9, wherein the low voltage enhancement-mode transistor comprises a first highly doped layer of a first conductivity type, a second doped layer of a second conductivity type complementary to the first conductivity type arranged on the first layer, a third lightly doped layer of the first conductivity type arranged on the second layer, and a fourth highly doped layer of the first conductivity type arranged on the third layer.

11. The semiconductor device of claim 10, wherein a portion of the fourth layer is uncovered by the high voltage depletion mode transistor and forms a surface of the composite semiconductor body.

12. The semiconductor device of claim 10, wherein the control electrode is arranged in a trench extending from an exposed surface of the fourth layer.

13. The semiconductor device of claim 10, wherein the control electrode is buried in the first, second and third layers.

14. The semiconductor device of claim 10, wherein the high voltage depletion-mode transistor comprises a buffer layer, a first semiconductor layer having a first bandgap arranged on the buffer layer, and a second semiconductor layer having a second bandgap different from the first bandgap.

15. The semiconductor device of claim 14, wherein the buffer layer is positioned on a region of an upper surface of the fourth layer such that the buffer layer is positioned adjacent the control electrode.

16. The semiconductor device of claim 1, wherein the low voltage enhancement-mode transistor is one of an n-channel MOSTET and a p-channel MOSFET.

17. The semiconductor device of claim 1, wherein the high voltage depletion-mode transistor and the low voltage enhancement-mode transistor are monolithically integrated together.

18. The semiconductor device of claim 1, wherein the high voltage depletion-mode transistor is directly driven by a gate driver.

19. The semiconductor device of claim 1, wherein the high voltage depletion-mode transistor is configured to block voltages of about 300 V or higher.

20. The semiconductor device of claim 1, wherein the low voltage enhancement-mode transistor is configured to block voltages of about 50V or lower.

21. The semiconductor device of claim 1, further comprising a source electrode arranged over a side face of the high voltage depletion-mode transistor.

22. A semiconductor device, comprising:
a composite semiconductor body; and
a hybrid device comprising a high voltage depletion-mode transistor and a low voltage enhancement-mode transistor integrated in the composite semiconductor body in a cascode arrangement, the hybrid device further comprising:
a source electrode electrically coupled to a source of the low voltage enhancement-mode transistor;
a drain electrode electrically coupled to a drain of the high voltage depletion-mode transistor;
and
at least one gate electrode for controlling the transistors of the hybrid device,
wherein the high voltage depletion-mode transistor is stacked on the low voltage enhancement-mode transistor so that an interface is formed between the high voltage depletion-mode transistor and the low voltage enhancement-mode transistor,
wherein the low voltage enhancement-mode transistor comprises a current path coupled in series with a current path of the high voltage depletion-mode transistor and a control electrode arranged at the interface,
wherein a source of the high voltage depletion-mode transistor is electrically coupled internally to a drain of the low voltage enhancement-mode transistor through a source electrode arranged over a side face of the high voltage depletion-mode transistor.

23. The semiconductor device of claim 22, wherein the at least one gate electrode comprises a single gate electrode electrically coupled to a gate of the low voltage enhancement-mode transistor, and wherein a gate of the high voltage depletion-mode transistor is electrically coupled to the source of the low voltage enhancement-mode transistor.

24. The semiconductor device of claim 22, wherein the at least one gate electrode comprises a single gate electrode electrically coupled to a gate of the low voltage enhancement-mode transistor and to a gate of the high voltage depletion-mode transistor.

25. The semiconductor device of claim 22, wherein the at least one gate electrode comprises a first gate electrode electrically coupled to a gate of the low voltage enhancement-mode transistor and a second gate electrode electrically coupled to a gate of the high voltage depletion-mode transistor.

* * * * *